United States Patent
Knaipp (10) Patent No.: US 9,685,437 B2
(45) Date of Patent: Jun. 20, 2017

(54) HIGH-VOLTAGE TRANSISTOR DEVICE AND PRODUCTION METHOD

(75) Inventor: Martin Knaipp, Unterpremstätten (AT)

(73) Assignee: AMS AG, Unterpremstaetten (AT)

( * ) Notice: Subject to any disclaimer, the term of this patent is extended or adjusted under 35 U.S.C. 154(b) by 406 days.

(21) Appl. No.: 14/234,364

(22) PCT Filed: Jul. 6, 2012

(86) PCT No.: PCT/EP2012/063282
§ 371 (c)(1),
(2), (4) Date: Jun. 11, 2014

(87) PCT Pub. No.: WO2013/013959
PCT Pub. Date: Jan. 31, 2013

(65) Prior Publication Data
US 2014/0361374 A1    Dec. 11, 2014

(30) Foreign Application Priority Data

Jul. 26, 2011  (DE) .................. 10 2011 108 651

(51) Int. Cl.
*H01L 21/70*    (2006.01)
*H01L 27/088*    (2006.01)
(Continued)

(52) U.S. Cl.
CPC .......... *H01L 27/088* (2013.01); *H01L 21/265* (2013.01); *H01L 21/823418* (2013.01);
(Continued)

(58) Field of Classification Search
CPC ............. H01L 29/0808; H01L 29/0821; H01L 29/0847; H01L 29/086; H01L 29/0878;
(Continued)

(56) References Cited

U.S. PATENT DOCUMENTS 4,890,146 A    12/1989  Williams et al.
5,473,180 A    12/1995  Ludikhuize
(Continued)

FOREIGN PATENT DOCUMENTS

EP    0514060 A2    11/1992
JP    57-211778 A    12/1982
WO    2007/128383 A1    11/2007

OTHER PUBLICATIONS

Quirk et al., Semiconductor Manufacturing Technology. Upper Saddle River: Prentice Hall Inc, 2001. Print.*

*Primary Examiner* — Mark Tornow
*Assistant Examiner* — Priya Rampersaud
(74) *Attorney, Agent, or Firm* — McDermott Will & Emery LLP (57) ABSTRACT

The high-voltage transistor device has a p-type semiconductor substrate that is furnished with a p-type epitaxial layer. A well and a body region are located in the epitaxial layer. A source region is arranged in the body region, and a drain region is arranged in the well. A channel region is located in the body region between the well and the source region. A gate electrode is arranged above the channel region. In the part of the semiconductor substrate and the epitaxial layer underneath the source region and the channel region, a deep body region is present, which has a higher dopant concentration in comparison to the remainder of the semiconductor substrate.

9 Claims, 4 Drawing Sheets (51) Int. Cl.
*H01L 29/40* (2006.01)
*H01L 29/66* (2006.01)
*H01L 29/78* (2006.01)
*H01L 29/10* (2006.01)
*H01L 21/265* (2006.01)
*H01L 21/8234* (2006.01)
*H01L 29/08* (2006.01)
*H01L 21/336* (2006.01)
*H01L 27/092* (2006.01)
*H01L 29/06* (2006.01)

(52) U.S. Cl.
CPC .. *H01L 21/823493* (2013.01); *H01L 29/0847* (2013.01); *H01L 29/1083* (2013.01); *H01L 29/1095* (2013.01); *H01L 29/402* (2013.01); *H01L 29/404* (2013.01); *H01L 29/66659* (2013.01); *H01L 29/7835* (2013.01); *H01L 27/0922* (2013.01); *H01L 29/0692* (2013.01)

(58) Field of Classification Search
CPC ............. H01L 29/1045; H01L 29/1095; H01L 29/66325; H01L 29/7393; H01L 29/7394; H01L 29/7816; H01L 29/7824; H01L 29/7835
See application file for complete search history.

(56) References Cited

U.S. PATENT DOCUMENTS

| | | | | |
|---|---|---|---|---|
| 6,200,879 | B1* | 3/2001 | Tyagi | H01L 21/76237 257/E21.551 |
| 2002/0125541 | A1* | 9/2002 | Korec | H01L 27/0817 257/471 |
| 2003/0228729 | A1* | 12/2003 | Efland | H01L 21/761 438/207 |
| 2004/0063291 | A1* | 4/2004 | Williams | H01L 21/26513 438/309 |
| 2004/0173846 | A1 | 9/2004 | Hergenrother et al. | |
| 2005/0194656 | A1* | 9/2005 | Shimizu | H01L 29/0878 257/488 |
| 2011/0049621 | A1* | 3/2011 | Lotfi | H01L 21/823807 257/337 |
| 2011/0303977 | A1* | 12/2011 | Huang | H01L 21/8249 257/339 |
| 2011/0309442 | A1* | 12/2011 | Grote | H01L 29/0634 257/339 |

\* cited by examiner

HIGH-VOLTAGE TRANSISTOR DEVICE AND PRODUCTION METHOD

The present invention relates to a transistor device for high-voltage applications and modular construction.

The production of high-voltage transistors uses semiconductor substrates that are furnished with an epitaxial layer. Such a technique is described, for example, in ISPSD2010, page 93 ff. The semiconductor substrates typically have a resistance that is adjusted by an appropriate base doping and satisfies the required voltage resistance. For low-voltage transistors with moderate voltages up to 100 V, substrates with a resistance of typically 10 Ωcm to 30 Ωcm are used. A substrate resistance of 300 Ωcm to 400 Ωcm is required for high-voltage transistors with voltages of 600 V to 700 V. If high-voltage transistors are integrated with low-voltage transistors, the properties of the low-voltage transistors resulting from a substrate resistance of 10 Ωcm to 30 Ωcm should remain unchanged, if possible.

The present invention specifies a transistor device for applications in the ultrahigh-voltage range (in the typical voltage range up to 700 V) that is suitable for modular use with conventional high- and/or low-voltage transistors (in the typical voltage range up to 100 V).

The high-voltage transistor device has a p-type semiconductor substrate that is furnished with a p-type epitaxial layer. In the epitaxial layer, there is a well of a first conductivity type and a body region of a conductivity type opposite the first conductivity type. A source region of the first conductivity type is arranged in the body region and a drain region of the first conductivity type is arranged in the well. A channel region is located in the body region between the well and the source region. A gate electrode is arranged above the channel region. A deep body region of the second conductivity type is present in the semiconductor substrate and in the epitaxial layer, underneath the source region and the channel region. Adjacent to the deep body region, semiconductor material of the second conductivity type is present in the semiconductor substrate and the epitaxial layer. The deep body region has a higher dopant concentration than the adjacent semiconductor material of the second conductivity type.

In embodiments, the first conductivity type is n-type and the second conductivity type is p-type. In another such embodiment, an additional high-voltage transistor is present, which is formed with a p-type well in the epitaxial layer above an n-type body well, an n-type body region in the epitaxial layer, a p-type source region in the body region, a p-type drain region in the p-type well, an additional channel region, which is arranged in the n-type body region between the p-type well in the p-type source region, and an additional gate electrode that is arranged in the additional channel region. An n-type sinker well region is located in the semiconductor substrate and in the epitaxial layer underneath the p-type source region and additional channel region, the n-type sinker well region having a higher dopant concentration than the n-type body well. The sinker well region extends the n-type body region downward with increasing dopant concentration to the semiconductor substrate and connects the n-type body region electrically to the body well.

In further embodiments, the first conductivity type is p-type and the second conductivity type is n-type, the well is arranged above an n-type body well, and the deep body region is an n-type sinker well that extends the body region downward with increasing dopant concentration into the semiconductor substrate and connects it electrically to the body well.

In further embodiments, the semiconductor substrate has a dopant concentration of less than $5 \times 10^{13}$ cm$^{-3}$ in certain areas, and the deep body region has a dopant concentration with a maximum value of at least $5 \times 10^{14}$ cm$^{-3}$.

In a further embodiment, the epitaxial layer has a first sublayer with a maximum first dopant concentration inside this first sublayer, and a second sublayer with a maximum second dopant concentration inside this second sublayer, and the first dopant concentration is lower than the second dopant concentration.

In a further embodiment, the gate electrode is electrically connected to a field plate and the field plate is extended by at least one conductor plate arranged above the well in certain areas. In this embodiment, the field plate can be extended, in particular, by at least two conductor plates that belong to at least two different metallization planes.

In the manufacturing method, a p-type epitaxial layer is produced on a p-type semiconductor substrate, and a high-voltage transistor with a source region, a drain region and a channel region is produced in the epitaxial layer. Before production of the epitaxial layer, a dopant for n-type conductivity or for p-type conductivity is implanted into the semiconductor substrate, which produces a deep body region provided underneath the source region and the channel region. The epitaxial layer is produced in such a manner that it has a higher dopant concentration a distance away from the semiconductor substrate than at the semiconductor substrate, i.e., in a region adjoining the semiconductor substrate.

In an embodiment of the method, the epitaxial layer is produced by growing a p-type doped first sublayer on the semiconductor substrate and growing a more highly doped p-type second sublayer on the first sublayer.

In a further embodiment of the method, the deep body region is implanted for p-type conductivity, and a substrate compensation region that is cut out underneath the drain region is produced with this implantation.

In a further embodiment of the method, the semiconductor substrate has a dopant concentration of less than $5 \times 10^{13}$ cm$^{-3}$, and implantation of the deep body region is undertaken with boron in a dose in the range from $1 \times 10^{12}$ cm$^{-2}$ to $5 \times 10^{12}$ cm$^{-2}$.

In a further embodiment of the method, the deep body region is implanted for n-type conductivity, and a sinker well region, which is provided underneath the source region and the channel region, is produced with this implantation. An additional implantation of dopant for n-type conductivity for producing a body well underneath the drain region is performed before the production of the epitaxial layer. The body well is connected electrically to the channel region by means of a diffusion of the dopant.

In additional embodiments of the method, the semiconductor substrate has a dopant concentration of less than $5 \times 10^{13}$ cm$^{-3}$, the body well is implanted with phosphorus or arsenic in a dose in the range from $5 \times 10^{11}$ cm$^{-2}$ to $5 \times 10^{12}$ cm$^{-2}$, and the sinker well region is implanted with phosphorus or arsenic in a dose in the range from $5 \times 10^{13}$ cm$^{-2}$ to $5 \times 10^{14}$ cm$^{-2}$.

The following is a more detailed description of the high-voltage transistor device and the production method with reference to the figures.

Figure 1:
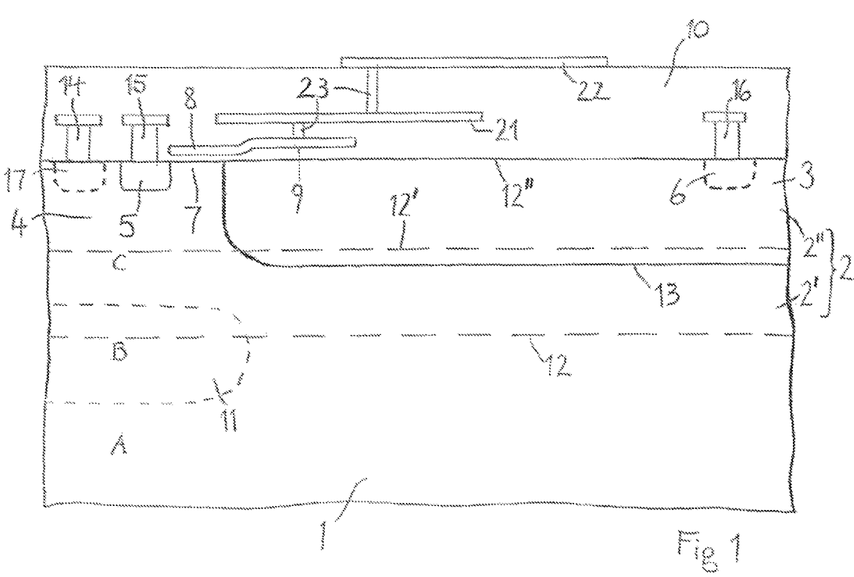
FIG. 1 shows a cross section through an embodiment of an NMOS for the high-voltage transistor device.

The cross section of FIG. 1 shows a high-voltage NMOS transistor. An epitaxial layer 2, comprising a first sublayer 2' and a second sublayer 2" in the present embodiment, is grown on a semiconductor substrate 1. The semiconductor substrate 1 and the epitaxial layer 2 have p-type conductivity. The semiconductor substrate 1 has a dopant concentration of typically $3 \times 10^{13}$ cm$^{-3}$, which corresponds to a resistance of approximately 400 Ωcm. The first sublayer 2' can have approximately the same dopant concentration, of boron atoms for example. The second sublayer 2" preferably has a substantially higher dopant concentration of typically $7 \times 10^{14}$ cm$^{-3}$, which corresponds to a resistance of approximately 20 Ωcm. The sublayers 2', 2" can have typical thicknesses of approximately 5 μm each.

An n-well 3 is formed in the epitaxial layer 2 and is provided for a drain region and a drift section of the transistor. The lower boundary 13 of the n-well 3 is typically located underneath the boundary 12' between the sub layers 2', 2", but can be above the lower boundary 12 of the epitaxial layer 2. The depth of the n-well 3 thus comprises at least the layer thickness of the higher-doped second sublayer 2". If the second sublayer 2" is 5 μm thick, the n-well 3 can be approximately 6 μm thick, for example. The lower-doped first sublayer 2' is provided for forming the pn junction at the lower boundary 13 of the n-well 3 as flat as possible. The vertical component of the electrical field appearing underneath the drain during operation of the high-voltage NMOS transistor must not exceed the critical field strength, at which impact ionization occurs. Arranging the lower-doped first sublayer 2' and the higher-doped second sublayer 2" has the effect that a sufficiently soft transition from the n-well 3 to the p-type semiconductor material is produced by diffusion of the dopant and withstands the provided voltages.

Outside the n-type well 3, there is a p-type body region 4, in which a p-type body contact region 17 and an n-type source 5 region are located, on the upper side 12" of the epitaxial layer 2. An n-type drain region 6 is formed in the n-well 3. The body contact region 17, the source region 5 and the drain region 6 preferably have dopant concentrations that are sufficiently high for the formation of a low-impedance metal-semiconductor contact to an upper-side body terminal 14, an upper-side source terminal 15 and an upper-side drain terminal 16, respectively.

A channel region 7, above which a gate electrode 8 is arranged, is located between the source region 5 and the n-well 3. The gate electrode 8 can be connected electrically to a field plate 9, which is present at least above a section of the region of the n-well 3 provided as a drift section. The gate electrode 8, the field plate 9, the body terminal 14, the source terminal 15 and the drain terminal 16 can be arranged in a dielectric 10. In preferred embodiments, the field plate 9 is extended by conductor plates 21, 22, which preferably belong to at least two different metallization planes and are electrically connected to the field plate 9 by means of plated through-holes 23 that are led through the dielectric 10. In other embodiments, it can be advantageous if only one conductor plate 21 that has suitable dimensions is connected to the field plate 9. For the desired adjustment of the electric potential curve, the conductor plates 21, 22 can be present above different-sized regions of the n-well 3, as shown in FIG. 1 as an example.

A p-type deep body region 11, which has a higher dopant concentration than the surrounding semiconductor material, is located in the semiconductor substrate 1 and the epitaxial layer 2 underneath the body contact region 17 and the source region 5. The dopant concentration of the deep body region 11 has a profile declining outward without a sharp delimitation. The extent of the deep body region 11 can vary according to the requirements placed on the device, preferably reaching as far as below the lateral edge of the n-well 3, corresponding approximately to the region bounded by a broken line in FIG. 1. The semiconductor substrate 1 can have a dopant concentration of less than $5 \times 10^{13}$ cm$^{-3}$ in certain areas. The deep body region 11 in this case preferably has a dopant concentration with a maximum value of at least $5 \times 10^{14}$ cm$^{-3}$.

The deep body region 11 can be produced by an implantation of dopant such as boron in the semiconductor substrate 1 before the epitaxial layer 2 is grown. In typical embodiments, the implantation dose lies in the range from $1 \times 10^{12}$ cm$^{-2}$ to $5 \times 10^{12}$ cm$^{-2}$. After a diffusion of the implanted dopant, the deep body region 11 reaches down to and into the epitaxial layer 2, and preferably only into the first sublayer 2'.

The dopant concentrations of the points A, B and C drawn in FIG. 1 are typically approximately $5 \times 10^{13}$ cm$^{-3}$, $1 \times 10^{15}$ cm$^{-3}$ and $4 \times 10^{14}$ cm$^{-3}$, respectively. Due to the deep body region 11, the resistance of the semiconductor substrate 1 underneath the channel region 7 is reduced up to the n-well 3. The objective is to improve the breakdown conditions for the transistor, with breakdown voltages in the range of several hundred volts, by shifting the electrical field farther towards the drain. The implantation of the deep body region 11 preferably also has the function of creating a substrate compensation region of as large an area as needed, which can be provided at the lower boundary 12 of the epitaxial layer 2 everywhere that transistors are integrated for which a conventional lower substrate resistance is desired. This will be explained below with reference to FIGS. 3 and 4.

Figure 2:
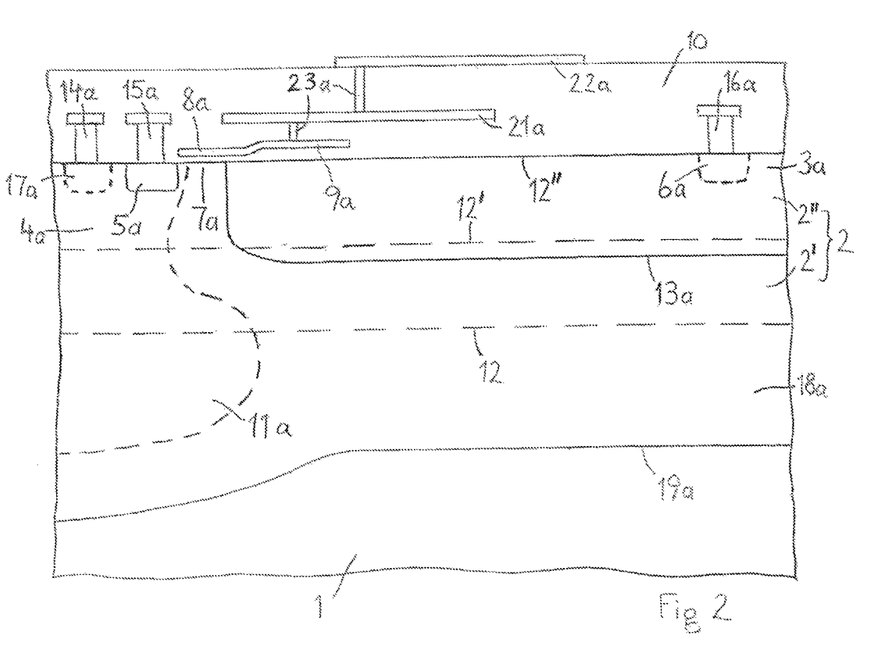
FIG. 2 shows a cross section through an embodiment of a PMOS for the high-voltage transistor device.

The cross section of FIG. 2 shows a high-voltage PMOS transistor, which can be integrated together with the high-voltage NMOS transistor according to FIG. 1 in the high-voltage transistor device. Before the production of the epitaxial layer 2, the deep body region is implanted as a sinker well region 11a and a body well 18a, each for n-type conductivity, but with different implantation doses. A p-well 3a, which contains a p-type drain region 6a and a drift section of the PMOS transistor, is formed in the epitaxial layer 2 above the body well 18a. The lower boundary 13a of the p-well 3a can be located underneath the boundary 12' between the sublayers 2', 2" of the epitaxial layer 2, but must be above the lower boundary 12 of the epitaxial layer 2. If the second sublayer 2" is 5 μm thick, the p-well 3a can be approximately 6 μm thick, for example.

An n-type body region 4a is located outside the p-well 3a, on the upper side 12" of the epitaxial layer 2. The lower boundary 19a of the n-type body well 18a is located inside the semiconductor substrate 1 underneath the lower boundary 12 of the epitaxial layer 2. In order to obtain a soft transition from the p-type drain region 6a to the n-type body well 18a, the body well 18a should be formed as far as possible underneath the upper side 12" of the epitaxial layer 2. An n-type body contact region 17a and a p-type source region 5a are arranged in the body region 4a. The body contact region 17a, the source region 5a and the drain region 6a preferably have dopant concentrations that are sufficiently high for the formation of a low-impedance metal-semiconductor contact to an upper-side body terminal 14a, an upper-side source terminal 15a and an upper-side drain terminal 16a, respectively.

A channel region 7a, above which a gate electrode 8a is arranged, is located between the source region 5a and the p-well 3a. The gate electrode 8a can be connected electrically to a field plate 9a, which is present at least above a section of the region of the p-well 3a provided as a drift section. The gate electrode 8a, the field plate 9a, the body terminal 14a, the source terminal 15a and the drain terminal 16a can be arranged in the dielectric 10. Conductor plates 21a, 22a, which preferably belong to at least two different metallization planes and are electrically connected to the field plate 9a by means of plated through-holes 23a that are led through the dielectric 10, are present above the p-well 3a for the desired adjustment of the electric potential curve. The conductor plates 21a, 22a can be present over different-sized regions of the p-well 3a, as shown in FIG. 2 as an example.

An n-type sinker well region 11a, which has a higher dopant concentration than the surrounding semiconductor material, is located in the semiconductor substrate 1 and the epitaxial layer 2 underneath the body contact region 17a and the source region 5a. The semiconductor substrate 1 can have a dopant concentration of less than $5 \times 10^{13}$ cm$^{-3}$ in certain areas. In this case the sinker well region 11a preferably has a dopant concentration with a maximum value of at least $5 \times 10^{14}$ cm$^{-3}$ or, in additional embodiments, at least $1 \times 10^{16}$ cm$^{-3}$. The dopant concentration of the sinker well region 11a has a profile declining outward without a sharp delimitation. The extent of the sinker well region 11a can vary according to the requirements placed on the device, preferably reaching as far as below the lateral edge of the p-well 3a, corresponding approximately to the region bounded by a broken line in FIG. 2.

The sinker well region 11a can be produced by an implantation of a dopant for n-type conductivity such as phosphorus or arsenic in the semiconductor substrate 1 before the epitaxial layer 2 is grown. In typical embodiments, the implantation dose lies in the range from $5 \times 10^{13}$ cm$^{-2}$ to $5 \times 10^{14}$ cm$^{-2}$. The body well 18a is also implanted in this case with phosphorus or arsenic, with a dose in the range from $5 \times 10^{11}$ cm$^{-2}$ to $5 \times 10^{12}$ cm$^{-2}$ in typical embodiments. The sinker well region 11a is subsequently enlarged by a diffusion of the implanted dopant, so that it extends into the epitaxial layer 2.

A low-impedance body terminal can be realized from the upper side of the device through a portion of the implantation provided for the n-well 3 of the NMOS transistor and from below through the sinker well region 11a. The sinker well region 11a is also suited for improving the properties of the channel-side region of the drift section in the p-well 3a, particularly with respect to the distribution of the electric field. The sinker well region 11a of the PMOS transistor fulfills similar functions in regard to the improvement of the transistor properties to those of the deep body region 11 of the NMOS transistor in accordance with FIG. 1.

An additional p-type implantation in the drift section is preferably provided to the PMOS transistor. This implantation can be performed directly prior to the diffusion of the dopant provided for n-type connectivity in the n-well 3 and the n-type body region 4a. Corresponding to the pn junction underneath the drain of the NMOS transistor, a sufficiently soft transition from the p-well 3a to the n-type body well 18a is produced in the PMOS transistor by diffusion of the dopant. This is intended to enable a high voltage underneath the drain when the drain terminal 16a and the substrate are at low potential ($V_{SS}$), while the body terminal 14a and the source terminal 15a are at high potential ($V_{DD}$).

Figure 3:
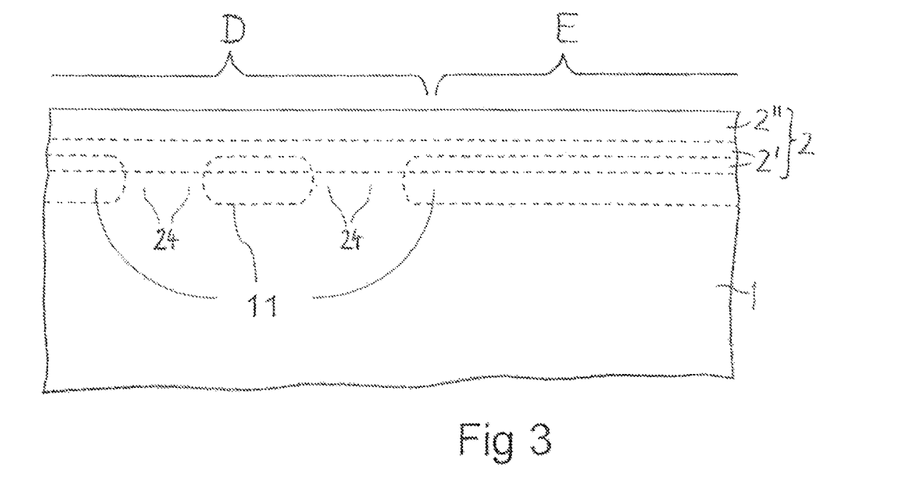
FIG. 3 shows a schematic cross section of the arrangement of a substrate compensation region.

FIG. 3 shows a schematic cross section through an embodiment of the high-voltage transistor device with a substrate compensation region 11 at the boundary between the semiconductor substrate 1 and the epitaxial layer 2. The substrate compensation region 11 is produced with the implantation for p-type conductivity, with which a p-type deep body region of an NMOS transistor in accordance with FIG. 1 can simultaneously be produced. It can be seen in FIG. 3 that the substrate compensation region 11 can be interrupted in a region D intended for ultrahigh-voltage transistors. Drain regions of the ultrahigh-voltage NMOS transistors can be arranged above these openings 24 of the substrate compensation region 11. The substrate compensation region 11 has the same function for these transistors as that of the deep body region 11 described above with reference to FIG. 1.

In a region E intended for conventional transistors, the substrate compensation region 11 is present over the entire surface and compensates for the high substrate resistance. This achieves the effect of a substrate with a resistance of typically 10 Ωcm to 30 Ωcm, and the properties of the transistors usually integrated on low-resistance substrates can be reproduced in this region E.

Figure 4:
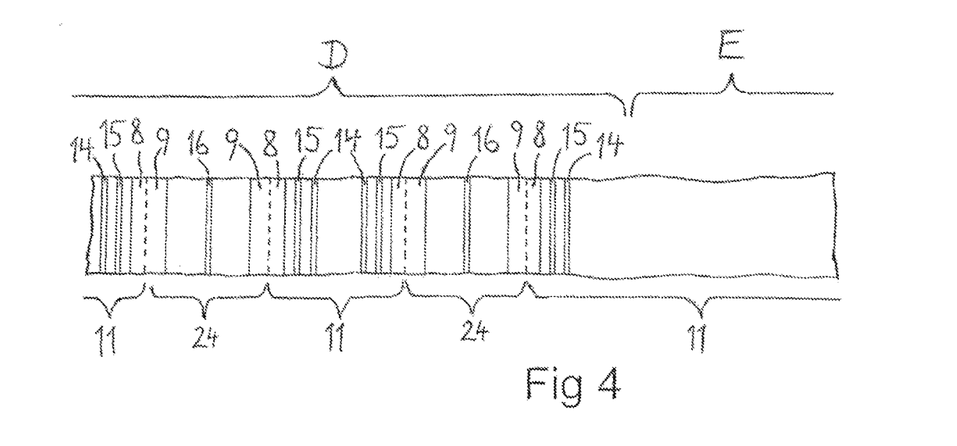
FIG. 4 shows a plan view of an embodiment according to FIG. 3.

FIG. 4 shows a cutout of a plan view of an embodiment of the high-voltage transistor device in accordance with FIG. 3 that has integrated ultra-high-voltage NMOS transistors according to FIG. 1, without showing the dielectric 10. In this embodiment, the gate electrodes 8 of the NMOS transistors, the field plates 9, the body terminals 14, the source terminals 15 and the drain terminals 16 are each formed in a strip shape and run parallel to one another. The concealed contours of the substrate compensation region 11 are reproduced with broken lines. It can be seen that the drains are each arranged above one of the openings 24 of the substrate compensation region 11, so that the high resistance of the semiconductor substrate 1 takes effect there. The substrate compensation region 11 is present over the full surface in the region E intended for conventional transistors.

FIG. 4 is only intended to show a typical application of the substrate compensation region 11. The arrangement of the openings 24 and of the transistor devices can be varied as needed. The substrate compensation region 11 on one hand enables the use of a high-resistance substrate without detriment to the likewise integrated low-voltage transistors, and on the other hand enables the improvement of the properties of the ultrahigh-voltage NMOS transistors by means of the higher-doped deep body regions under the source and the channel.

Figure 5:
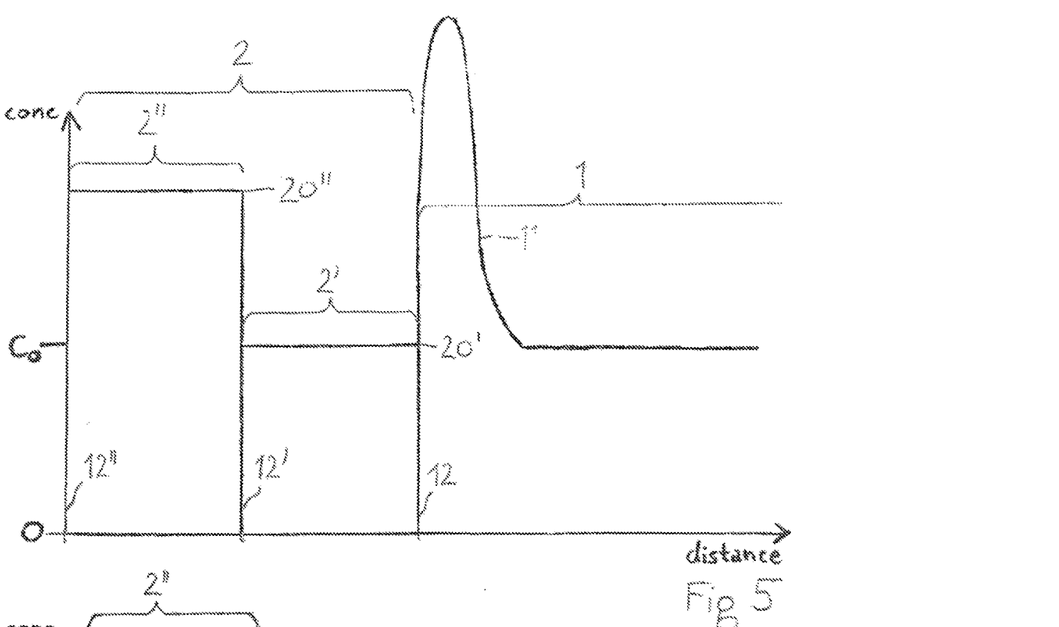
FIG. 5 shows a diagram of the dopant concentration in the substrate and the epitaxial layer before a diffusion of the dopant.

FIG. 5 shows a diagram in which the dopant concentrations ("conc," increasing in the direction of the arrow), for example the concentration of boron atoms, is plotted versus the distance from the surface 12" of the epitaxial layer 2 ("distance," increasing to the right in the direction of the arrow) for an embodiment of the manufacturing method. The dopant concentration $c_0$ of the semiconductor substrate 1 (a base doping, for example) is increased at the lower boundary 12 of the epitaxial layer 2 by the implantation of the substrate compensation region 11. The dopant concentration in the epitaxial layer 2 can be adjusted during growth ("in situ"). Before the diffusion of the dopant, the dopant concentration in the first sublayer 2' of the epitaxial layer 2 is at least approximately constant (first dopant concentration 20'), corresponding in particular to the dopant concentration $c_0$ of the semiconductor substrate 1, for example, and lower than the dopant concentration of the substrate compensation region 11. The dopant concentration in the second sublayer 2" of the epitaxial layer 2 is likewise at least approximately constant (second dopant concentration 20"), and is higher than the dopant concentration in the first sublayer 2' of the epitaxial layer 2.

Figure 6:
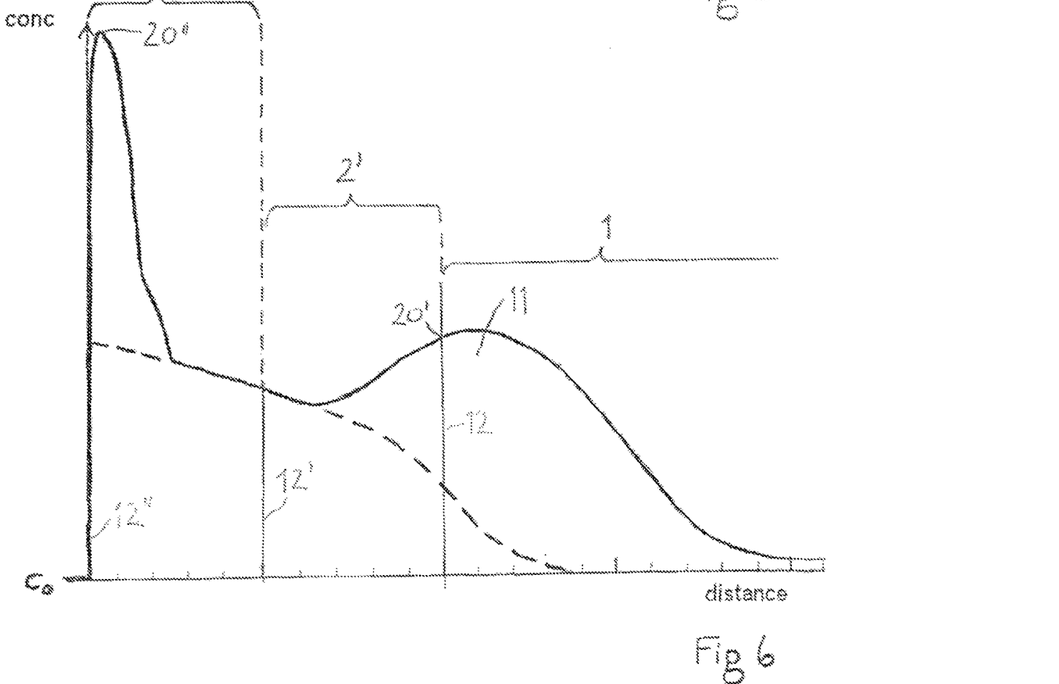
FIG. 6 shows a diagram of the dopant concentration in the substrate and the epitaxial layer after a near-surface diffusion of the dopant.

FIG. 6 shows a cross section according to FIG. 5 after diffusion of the dopant. After the diffusion of the dopant, an additional near-surface implantation for p-type conductivity in the epitaxial layer 2 is performed that increases the dopant concentration there. The broken-line curve shows the progression of the dopant concentration for the case that neither the implantation of the substrate compensation region 11 nor the near-surface implantation have been performed. At the lower boundary 12 of the epitaxial layer 2, the dopant has mainly diffused in the direction from the substrate compensation region 11 into the first sublayer 2', so that a maximum dopant concentration of the first sublayer 2' (maximum first dopant concentration 20') is now present at the lower boundary 12 of the epitaxial layer 2. At the boundary 12' between the sublayers 2', 2", the dopant has mainly diffused in the direction from the second sublayer 2" into the first sublayer 2', and the near-surface implantation for p-type conductivity in the epitaxial layer 2 has also been performed, so that now a maximum dopant concentration of the second sublayer 2" is present in the vicinity of the upper side 12" of the epitaxial layer 2 (maximum second dopant concentration 20").

The manner in which the implantation of the substrate compensation region 11 and the growth of the sublayers 2', 2" with different doping in the epitaxial layer 2 produce a locally differing dopant profile can be seen from FIGS. 5 and 6. This dopant profile above the substrate compensation region 11 is suitable for integrating conventional low-voltage transistors in low-resistance semiconductor material near the surface. Outside the area occupied by the substrate compensation region 11, the dopant profile is substantially determined by the sublayers 2', 2" of the epitaxial layer 2 and allows the formation of a flat pn junction inside the first sublayer 2', above which the drain regions of the ultrahigh-voltage NMOS transistors are arranged.

The high-voltage transistor device is suitable for optimizing high-voltage NMOS transistors and high-voltage PMOS transistors in the voltage range from 200 V to 700 V. It allows particularly high typical breakdown voltages in the range of 600 V to 700 V, without impairing the function of integrated conventional transistor devices, and therefore is particularly suitable for modular usage. The high-voltage transistor device can be realized with a combination of one or more high-voltage NMOS transistors and one or more high-voltage PMOS transistors, or without high-voltage PMOS transistors, only with one or more high-voltage NMOS transistors, or without NMOS transistors, only with one or more high-voltage PMOS transistors. If only high-voltage NMOS transistors are used, it is possible to forgo the implantations of the p-well 3a, the sinker well region 11a and the body well 18a.

LIST OF REFERENCE NUMBERS

1 Semiconductor substrate
2 Epitaxial layer
2' First sublayer of the epitaxial layer
2" Second sublayer of the epitaxial layer
3 n-well of the NMOS-Transistors
3a p-well of the PMOS transistor
4 p-type body region of the NMOS transistor
4a n-type body region of the PMOS transistor
5 n-type source region of the NMOS transistor
5a p-type source region of the PMOS transistor
6 n-type drain region of the NMOS transistor
6a p-type drain region of the PMOS transistor
7 Channel region of the NMOS transistor
7a Channel region of the PMOS transistor
8 Gate electrode of the NMOS transistor
8a Gate electrode of the PMOS transistor
9 Field plate of the NMOS transistor
9a Field plate of the PMOS transistor
10 Dielectric
11 Substrate compensation region
11a Sinker well region of the PMOS transistor
12 Lower boundary of the epitaxial layer
12' Boundary between the sublayers
12" Upper side of the epitaxial layer
13 Lower boundary of the n-well
13a Lower boundary of the p-well
14 Body terminal of the NMOS transistor
14a Body terminal of the PMOS transistor
15 Source terminal of the NMOS transistor
15a Source terminal of the PMOS transistor
16 Drain terminal of the NMOS transistor
16a Drain terminal of the PMOS transistor
17 Body contact region of the NMOS transistor
17a Body contact region of the PMOS transistor
18a Body well
19a Lower boundary of the body well
20' First dopant concentration
20" Second dopant concentration
21 First conductor plate of the NMOS transistor
21a First conductor plate of the PMOS transistor
22 Second conductor plate of the NMOS transistor
22a Second conductor plate of the PMOS transistor
23 Plated through-hole of the NMOS transistor
23a Plated through-hole of the PMOS transistor
24 Opening of the substrate compensation region
A Reference point
B Reference point
C Reference point
D Region intended for ultrahigh-voltage transistors
E Region intended for conventional transistors
$c_0$ Dopant concentration of the semiconductor substrate

The invention claimed is:

1. A high-voltage transistor device, comprising:
a p-type semiconductor substrate provided with a p-type epitaxial layer;
a high-voltage transistor, formed with
an n-type well in the p-type epitaxial layer,
a p-type body region in the p-type epitaxial layer,
an n-type source region in the p-type body region,
an n-type drain region in the n-type well,
a channel region arranged in the p-type body region between the n-type well and the n-type source region, and
a gate electrode arranged above the channel region, wherein
a substrate compensation region is present at the boundary between the p-type semiconductor substrate and the p-type epitaxial layer, the substrate compensation region forming a p-type deep body region underneath the n-type source region and the channel region, the p-type semiconductor substrate and the p-type epitaxial layer are present adjacent to the p-type deep body region, and the p-type deep body region has a higher dopant concentration than the adjacent p-type semiconductor material; and a further high-voltage transistor, which is formed with a p-type well in the p-type epitaxial layer above an n-type body well, an n-type body region in the p-type epitaxial layer, a p-type source region in the n-type body region, a p-type drain region in the p-type well, a further channel region arranged in the n-type body region between the p-type well and the p-type source region, a further gate electrode arranged above the further channel region, and an n-type sinker well region in the p-type semiconductor substrate and in the p-type epitaxial layer underneath the p-type source region and the further channel region, wherein the n-type sinker well region has a higher dopant concentration than the n-type body well, the n-type sinker well region extends the n-type body region towards the p-type semiconductor substrate with increasing dopant concentration and connects the n-type body region electrically to the n-type body well, the p-type epitaxial layer has a first sublayer and a second sublayer, the first sublayer being arranged between the second sublayer and the p-type semiconductor substrate, a lower boundary of the n-type well and a lower boundary of the p-type well are arranged in the first sublayer of the p-type epitaxial layer, and the dopant concentration of the first sublayer is smaller than the dopant concentration of the second sublayer and smaller than the dopant concentration of p-type semiconductor substrate at the boundary between p-type semiconductor substrate and the p-type epitaxial layer.

2. The high-voltage transistor device according to claim 1, wherein the p-type semiconductor substrate locally has a dopant concentration of less than $5 \times 10^{13}$ cm$^{-3}$, and the p-type deep body region has a dopant concentration with a maximum value of at least $5 \times 10^{14}$ cm$^{-3}$.

3. The high-voltage transistor device according to claim 1, wherein the first sublayer of the p-type epitaxial layer has a maximum first dopant concentration and the second sublayer of the p-type epitaxial layer has a maximum second dopant concentration, the maximum first dopant concentration being lower than the maximum second dopant concentration.

4. The high-voltage transistor device according to claim 1, further comprising:

a field plate, the gate electrode being electrically connected to the field plate, and at least one conductor plate arranged above at least part of the n-type well and extending the field plate.

5. A method of producing a high-voltage transistor device, comprising:

forming a p-type epitaxial layer on a p-type semiconductor substrate;

forming an n-type well and a p-type body region in the p-type epitaxial layer;

forming a high-voltage transistor with an n-type source region in the p-type body region, an n-type drain region in the n-type well, a channel region in the p-type epitaxial layer, the channel region being arranged in the p-type body region between the n-type well and the n-type source region, and a gate electrode above the channel region;

performing an implantation of dopant for p-type conductivity into the p-type semiconductor substrate before the p-type epitaxial layer is formed, the implantation providing a substrate compensation region at the boundary between the p-type semiconductor substrate and the p-type epitaxial layer, the substrate compensation region forming a p-type deep body region underneath the n-type source region and the channel region;

forming the p-type epitaxial layer in such a manner that the dopant concentration of the p-type epitaxial layer is higher at a distance from the p-type semiconductor substrate than at the interface between the p-type semiconductor substrate and the p-type epitaxial layer, and the p-type deep body region has a higher dopant concentration than that of the adjacent p-type semiconductor substrate and the p-type epitaxial layer material; and forming a further high-voltage transistor with an n-type body well, a p-type well in the p-type epitaxial layer above the n-type body well, an n-type body region in the p-type epitaxial layer, a p-type source region in the n-type body region, a p-type drain region in the p-type well, a further channel region arranged in the n-type body region between the p-type well and the p-type source region, a further gate electrode arranged above the further channel region, and an n-type sinker well region in the p-type semiconductor substrate and in the type epitaxial layer underneath the p-type source region and the further channel region, wherein the n-type sinker well region has a higher dopant concentration than the n-type body well, the n-type sinker well region extends the n-type body region towards the p-type semiconductor substrate with increasing dopant concentration, thus forming an n-type further deep body region, and connects the n-type body region electrically to the n-type body well, the p-type epitaxial layer is formed by growing a doped p-type first sublayer on the p-type semiconductor substrate and growing a more highly doped p-type second sublayer on the doped p-type first sublayer, and the n-type well and the p-type well extend into the doped p-type first sublayer.

6. The method according to claim 5, wherein the substrate compensation region is cut out underneath the n-type drain region.

7. The method according to claim 6, wherein the p-type semiconductor substrate has a dopant concentration of less than $5 \times 10^{13}$ cm$^{-3}$, and the p-type deep body region is implanted with boron in a dose in the range from $1 \times 10^{12}$ cm$^{-2}$ to $5 \times 10^{12}$ cm$^{-2}$.

8. The method according to claim 5, wherein
an additional implantation of dopant for n-type conductivity is performed before forming the p-type epitaxial layer,
the n-type body well is formed underneath the p-type drain region by the additional implantation, and
the n-type body well is electrically connected to the channel region by a diffusion of the dopant.

9. The method according to claim 8, wherein
the p-type semiconductor substrate has a dopant concentration of less than $5\times10^{13}$ cm$^{-3}$,
the n-type body well is implanted with phosphorus or arsenic in a dose in the range from $5\times10^{11}$ cm$^{-2}$ to $5\times10^{12}$ cm$^{-2}$, and
the n-type further deep body region is implanted with phosphorus or arsenic in a dose in the range from $5\times10^{13}$ cm$^{-2}$ to $5\times10^{14}$ cm$^{-2}$.

* * * * *